United States Patent [19]

Kaneko et al.

[11] Patent Number: 5,177,457

[45] Date of Patent: Jan. 5, 1993

[54] VARIABLE DELAY LINE

[75] Inventors: Mitsunori Kaneko; Yukinori Miyake, both of Tokyo, Japan

[73] Assignee: Hirose Electric Co., Ltd., Tokyo, Japan

[21] Appl. No.: 753,415

[22] Filed: Aug. 30, 1991

[30] Foreign Application Priority Data

Sep. 13, 1990 [JP] Japan .................................. 2-243524

[51] Int. Cl.$^5$ ............................................. H03H 7/20
[52] U.S. Cl. ..................................... 333/139; 333/140; 333/156; 333/149
[58] Field of Search ............... 333/139, 140, 149, 156, 333/162, 157, 158, 159, 160, 161, 163, 164, 138

[56] References Cited

U.S. PATENT DOCUMENTS

| 4,546,332 | 10/1985 | Kameya | 333/156 X |
| 4,620,164 | 10/1986 | Kameya | 333/139 |
| 4,642,588 | 2/1987 | Kameya | 333/139 |

Primary Examiner—Paul M. Dzierzynski
Assistant Examiner—Ali Neyzari
Attorney, Agent, or Firm—Kanesaka & Takeuchi

[57] ABSTRACT

A variable delay line includes a housing package (20, 21); an input terminal (27) extending outwardly from a first side of the housing package; an output terminal (28) extending outwardly from a second side of the housing package which is opposite to the first side; a circuit board (23) provided within the housing package; an input terminal connection land (31) provided on the circuit board and connected to an end of the input terminal; an output terminal connection land (32) provided on the circuit board and connected to an end of the output terminal; a plurality of delay elements (36); a plurality of pairs of delay element connection fixed pads (33), each pair thereof connected to each of the delay elements; and a plurality of series connection fixed contact pads (34, 35) each corresponding to each pair of the delay element connection fixed pads and connectable in series across the input and output terminal connection lands.

3 Claims, 5 Drawing Sheets

VARIABLE DELAY LINE

BACKGROUND OF THE INVENTION

1. Field of the Invention

The present invention relates to variable delay lines for adjusting the timing of high speed signal transmission between individual components of a computer, etc.

2. Description of the Prior Art

There are three types of variable delay lines; namely, (1) the semiconductor type which employs a semiconductor element; (2) the fixed type which makes use of fixed taps from the signal line which is opposed to the ground line; and (3) the sliding type which uses a sliding tap provided for the signal line which is opposed to the ground line.

The variable delay lines of the semiconductor type include a programmable delay line semiconductor element and an output buffer semiconductor element mounted on a circuit board within a package such that the amount of delay is changed by a driving power or controller.

As FIG. 8 shows, the variable delay lines of the fixed type include a ground line 1 and a signal line 2 opposed to the ground line 1 within a package which has an input terminal (1) to which an end of the signal line 2 is connected, intermediate tap terminals (2), (3), (4), (5), and (6), a ground terminal (7) to which the ground line 1 is connected, and an output terminal (8) to which the other end of the signal line 2 is connected. By selecting an intermediate tap terminal, it is possible to change the amount of delay.

As FIG. 9 shows, the variable delay lines of the sliding type include a ground line 3 and a signal line 4 opposed to the ground line 3 within a package, a signal input line 5 provided along the signal line 4, a sliding tap 6 across the signal line 3 and the input line 5, an input terminal 7 to which an end of the input line 5 is connected, an output terminal 8 to which an end of the signal line 4 is connected, and a ground terminal 9 to which the ground line 3 is connected. By moving the sliding tap 6 it is possible to change the amount of delay.

However, the variable delay lines of the semiconductor type not only require a driving power supply, complex circuitry, and a driving controller for controlling the drive, making them expensive as a whole but also have poor frequency characteristics because of the used semiconductor.

The variable delay lines of the fixed type employ one of the several intermediate taps so that there are many mismatching elements, providing poor frequency characteristics. For example, when the intermediate tap (4) is employed in FIG. 8, an element 10 consisting of the intermediate taps (2) and (3) and an element 11 consisting of the intermediate taps (5) and (6), part of the ground line 1, and part of the signal line 2 become mismatching, and their floating capacity and inductance provide poor characteristics.

The variable delay lines of the sliding type also bring about many mismatching elements, providing poor frequency characteristics. For example, the tap position in FIG. 9 is used, an element 12 consisting of part of the input line 5 and an element 13 consisting of part of the signal line 4 and part of the ground line 3 become mismatching, and their floating capacity and inductance provide poor frequency characteristics. In addition, it is difficult to know accurately the position of the sliding tap 6 and thus the amount of delay.

SUMMARY OF THE INVENTION

Accordingly, it is an object of the invention to provide at low costs a variable delay line for high speed transmission having excellent high frequency characteristics and allowing easy computation of the amount of delay.

According to the invention there is provided a variable delay line which includes an input terminal; an output terminal; a plurality of delay elements; and a series connection device for connecting in series at least one of the delay elements across the input and output terminals.

The variable delay line according to the invention has the following advantages:

(1) The amount of mismatching in use is much less than that of the conventional one so that the variable delay line according to the invention has excellent high frequency characteristics and is suitable for high speed signal transmission.
(2) It employs a manual switch so that it needs neither complex circuitry nor controller and is low in unit manufacturing costs.
(3) It can have a configuration identical with that of DIP switch so that it is easy to compute the amount of delay based on the contact knob positions.
(4) The movable spring contacts are depressed so that the movable contacts are extended or contracted according to the contact distances.
(5) One of a pair of contact pads is connected to one of the adjacent pair with a contact knob so that the delay elements can be selected at will.

The above and other objects, features, and advantages of the invention will be more apparent from the following description when taken in conjunction with the accompanying drawings.

DESCRIPTION OF THE PREFERRED EMBODIMENT

Figure 1:
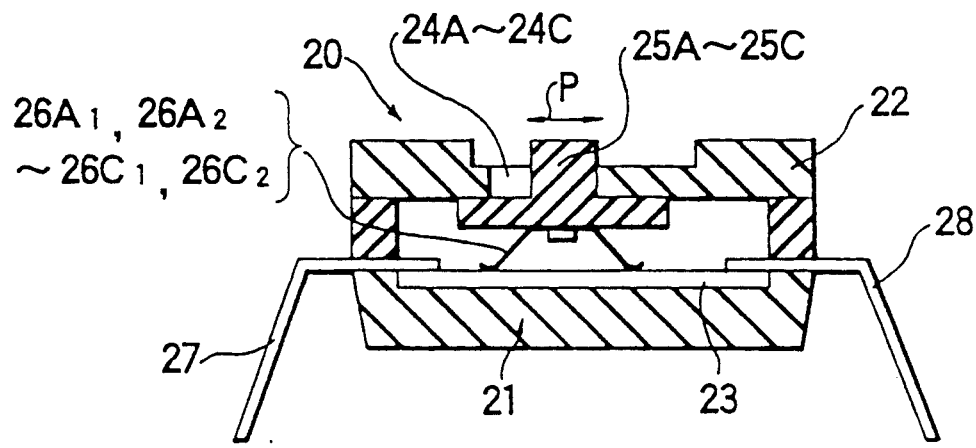
FIG. 1 is a cross section of a variable delay line according to an embodiment of the invention.
Figure 2:
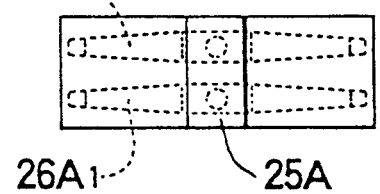
FIG. 2 is a top plan view of a contact knob portion of the variable delay line.

In FIG. 1, a variable delay line 20 includes a housing package consisting essentially of an insulation base 21 and an insulation cover 22. A circuit board 23 is mounted on the insulation base 21. Three openings 24A, 24B, and 24C are formed near the center of the insulation cover 22. Three contact knobs 25A, 25B, and 25C are provided on the insulation cover 22 such that they are movable in the direction of an arrow in the openings 24A, 24B, and 24C. Each contact knob 25A, 25B, or 25C has a pair of movable contacts 26A1 and 26A2, 26B1 and 26B2, or 26C1 and 26C2. The contact knob 25A is shown in FIG. 2 in detail. The movable contacts are designed to have a width equivalent to that of microstrip lines for matching. An input terminal 27 and an output terminal 28 extend outwardly from opposite sides of the insulation base 21.

Figure 3:
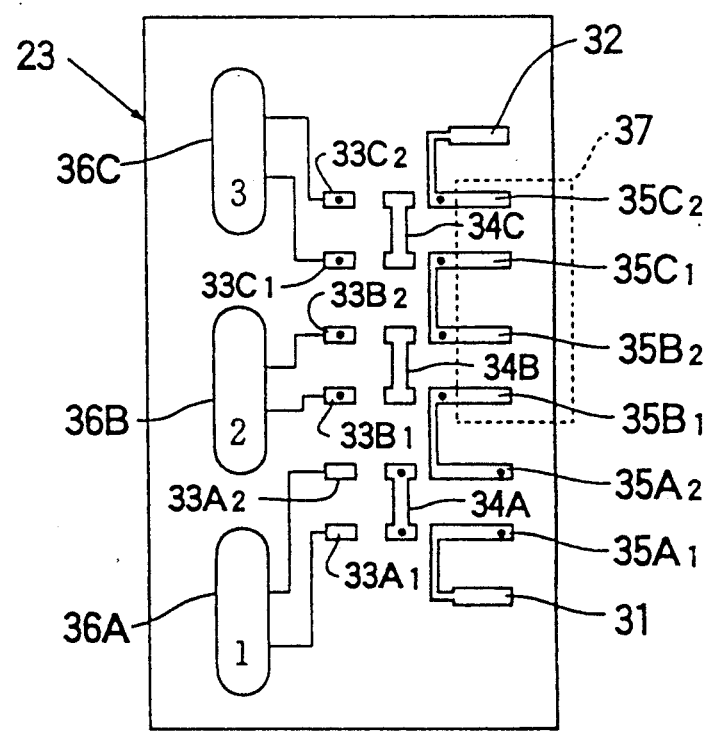
FIG. 3 is a top plan view of a circuit board of the variable delay line.

In FIG. 3, the circuit board 23 includes an input terminal connection land 31, an output terminal connection land 32, three pairs of delay element connection fixed contact pads 33A1 and 33A2, 33B1 and 33B2, and 33C1 and 33C2 three sets of serial connection fixed contact pads 34A, 35A1, and 35A2; 34B, 35B2, and 35B2; and 34C, 35C1, and 35C2, each set corresponding to each pair of delay element connection fixed contact pads, which can be connected in series across the input and output terminal connection lands 31 and 32. The serial connection fixed contact pad 35A1 is connected to the input terminal connection land 31, the serial connection fixed contact pad 35C2 is connected to the output terminal connection land 32, the serial connection fixed contact pad 35A2 is connected to the serial connection fixed contact pad 35B1, and the serial connection fixed contact pad 35B2 is connected to the serial connection fixed contact pad 35C1.

The delay element connection fixed contact pads 33A1 and 33A2, and the serial connection fixed contact pads 34A, 35A1, and 35A2 are positioned such that they are brought into contact with the moveable contacts 26A1 and 26A2 of the contact knob 25A. Similarly, the delay element connection fixed contact pads 33B1 and 33B2, and the serial connection fixed contact pads 34B, 35B1, and 35B2 are positioned such that they are brought into contact with the moveable contacts 26B1 and 26B2 of the contact knob 25B, and the delay element connection fixed contact pads 33C1 and 33C2 and the serial connection fixed contact pads 34C, 35C1 and 35C2 are positioned such that they are brought into contact with the movable contacts 26C1 and 26C2 of the contact knob 25C.

Three delay elements 36A, 36B, and 36C are connected across the delay element connection fixed pads 33A1 and 33A2, 33B1 and 33B2, and 33C1 and 33C2, respectively. These delay elements 36A, 36B, and 36C are any circuit such as an electrode formed on the circuit board or 3-D circuitry consisting of capacitance and inductance.

When the contact knob 25A, 25B, or 25C is on the positions as shown in FIG. 1, the respective movable contacts 26A1 and 26A2, 26B1 and 26B2, or 26C1 and 26C2 connect the serial connection fixed contact pads 34A, 34B, or 34C to the serial connection fixed contact pads 35A1 and 35A2, 35B1 and 35B2, or 35C1 and 35C2. When the contact knobs 25A, 25B, or 25C is moved to the left in FIG. 1, the movable contacts 26A1 and 26A2, 26B1 and 26B2, or 26C1 and 26C2 connect the delay element connection fixed contact pads 33A1 and 33A2, 33B1 and 33B2, or 33C1 and 33C2 to the serial connection fixed contact pads 35A1 and 35A2, 35B1 and 35B2, or 35C1 and 35C2. Now, the contact knobs 25B and 25C are moved to the left in FIG. 1 while the contact knob 25A is held in the right position of FIG. 1, the respective movable contacts are brought into contact with the fixed contact pads as marked with dots in FIG. 3. Consequently, the delay elements 36B and 36C are connected in series across the input terminal 27 and the output terminal 28. Since the fixed contact pads have little or no delay time, the amount of delay in the variable delay line is equal to the sum of the amounts of delay of the respective delay elements 36B and 36C.

In the above embodiment, a mismatching element 37 consists of only portions of the serial connection fixed contact pads 35B1, 35B2, 35C1, and 35C2 so that the high frequency characteristics of the variable delay line is improved very much. In this way, by moving the contact knobs 25A, 25B, and 25C to make various combinations of the delay elements 36A, 36B, and 36C, it is possible to provide many different amounts of delay.

Figure 4:
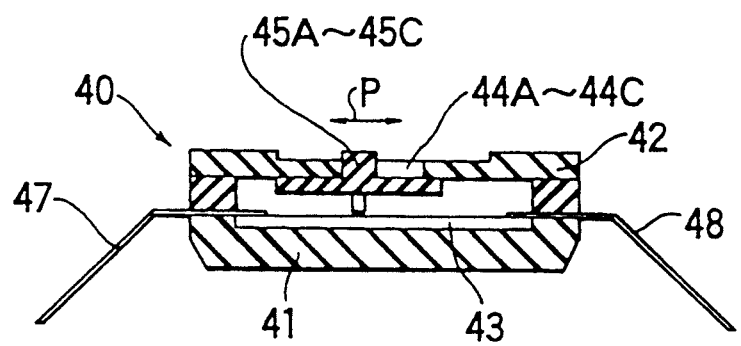
FIG. 4 is a cross section of a variable delay line according to another embodiment of the invention.
Figure 6:
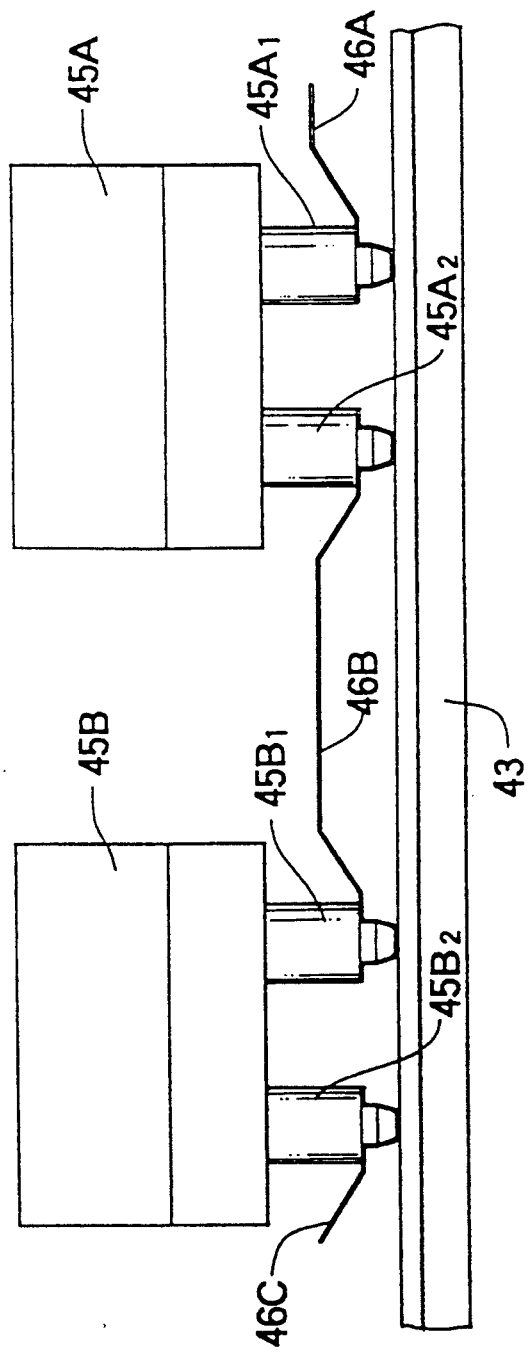
FIG. 6 is a side elevational view of a contact knob portion of the variable delay line of FIG. 4.

In FIG. 4, a variable delay line 40 includes a housing package consisting essentially of an insulation base 41 and an insulation cover 42. A circuit board 43 is mounted on the insulation base 41. Three openings 44A, 44B, and 44C are formed on the insulation cover 42. Three contact knobs 45A, 45B, and 45C are provided on the insulation cover 42 such that they are movable in the direction of an arrow within the openings 44A, 44B, and 44C. As FIG. 6 shows, a pair of movable contact pivots 45A1 and 45A2, 45B1 and 45B2, or 45C1 and 45C2 are attached to the contact knob 45A, 45B, or 45C. Four movable contacts 46A, 46B, 46C, and 46D are pivoted to the lower ends of the respective movable contact pivots 45A1, 45A2, 45B1, 45B2, 45C1, and 45C2 These movable contacts are designed to have a width equal to that of microstrip lines for matching. An input terminal 47 and an output terminal 48 extend outwardly from opposite sides of the insulation base 41.

Figure 5:
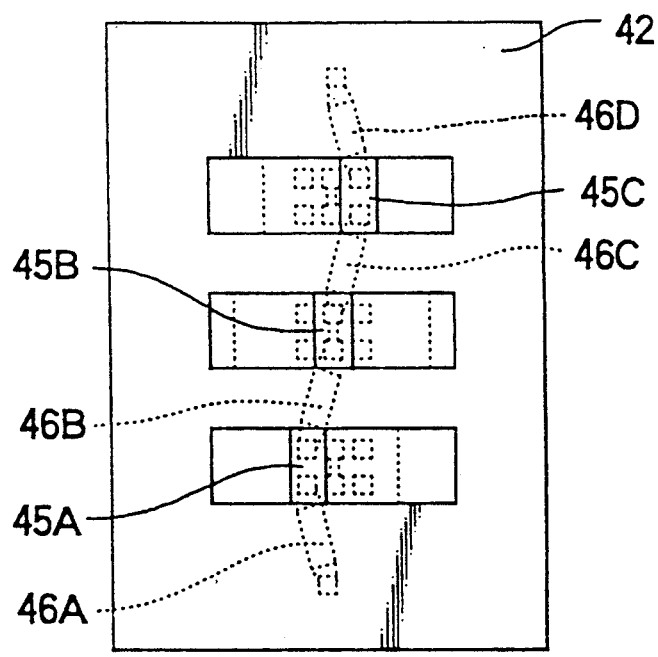
FIG. 5 is a top plan view of the variable delay line of FIG. 4.
Figure 7:
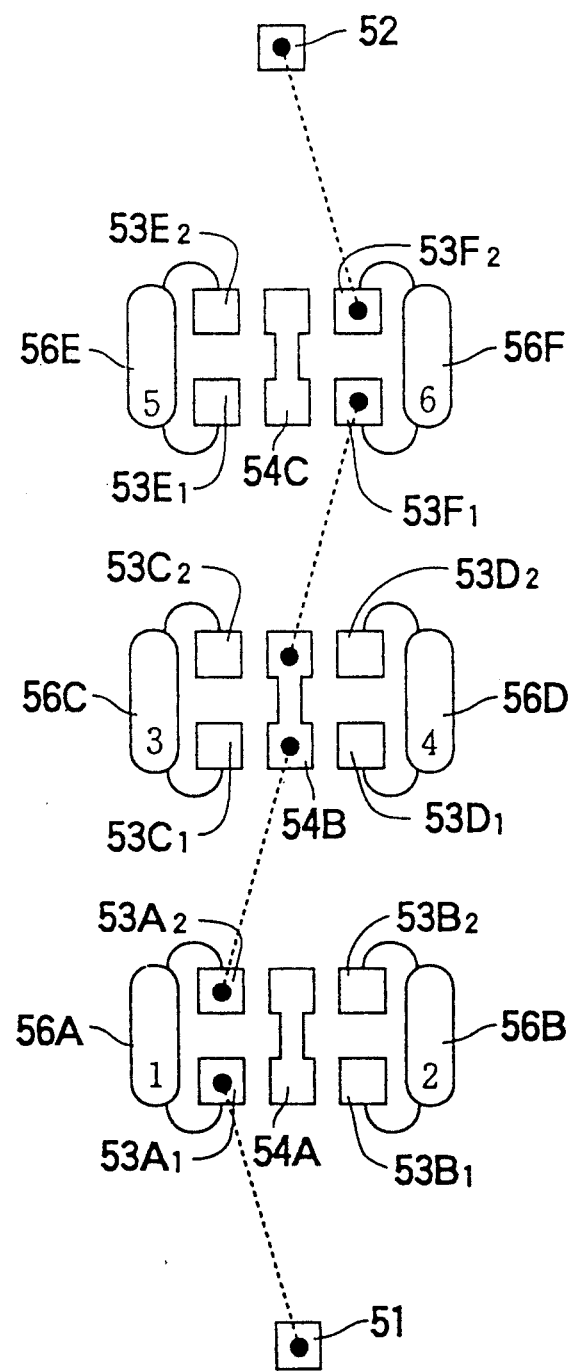
FIG. 7 is a top plan view of a circuit board of the variable delay line of FIG. 4.
Figure 8:
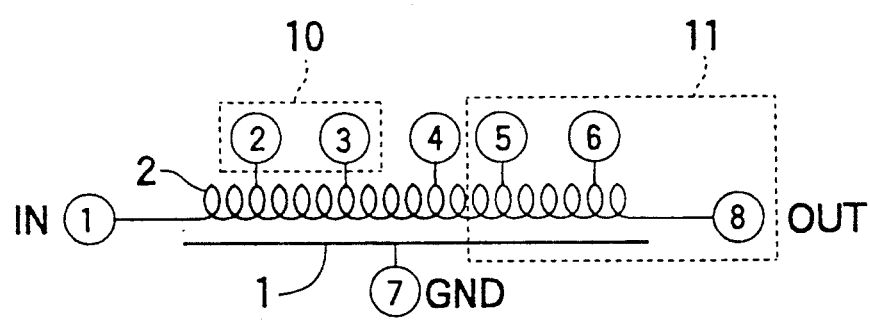
FIG. 8 is a schematic diagram of a conventional variable delay line.
Figure 9:
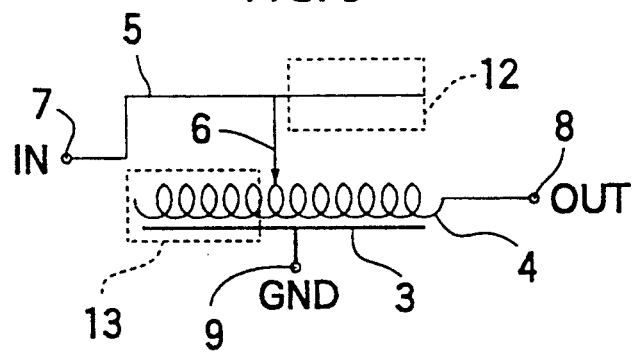
FIG. 9 is a schematic diagram of another conventional variable delay line.

In FIG. 7, on the circuit board 43 there are provided an input terminal connection land 51 to which an end of the input terminal 47 is connected, an output terminal connection land 52 to which an end of the output terminal 48 is connected, six pairs of delay element connection fixed contact pads 53A1 and 53A2, 53B1 and 53B2, 53C1 and 53C2, 54D1 and 53D2, 53E1 and 53E2, and 53F1 and 53F2 to which six delay elements 56 are connected, and three series connection fixed contact pads 54A, 54B, and 54C positioned between the corresponding delay elements connection fixed contact pads 53A1, 53A2 and 53B1, 53B2, 53C1, 53C2 and 53D1, 53D2, and 53E1, 53E2 and 53F1, 53F2 so as to be connectable in series across the input and output terminal lands 51 and 52. As best shown in FIG. 5, an end of the movable contact 46A is pivoted to the input terminal connection land 51 while an end of the movable contact 46D is connected to the output terminal connection land 52.

The delay element connection fixed contact pads 53A1 and 53A2, and 53B1 and 53B2, and the series connection fixed contact pad 54A are positioned such that they are brought into contact with the lower ends of the movable contact pivots 45A1 and 45A2 of the contact knob 45A. Similarly, the delay element connection fixed contact pads 53C1, 53C2, 53D1, and 53D2, and the series connection fixed pad 54B are positioned such that they are brought into contact with the lower ends of the movable contact pivots 45B1 and 45B2, and the delay element connection fixed pads 53E1 and 53E2, 53F1, and 53F2, and the series connection fixed connection pad 54C are positioned such that they are brought into contact with the lower ends of the movable contact pivots 45C1 and 45C2.

Six delay elements 56A, 56B, 56C, 56D, 56E, and 56F are connected across the delay element connection contact pads 53A1 and 53A2, 53B1 and 53B2, 53C1 and 53C2, 53D1 and 53D2, 53E1 and 53E2, and 53F1 and 53F2, respectively. These delay elements 56A, 56B, 56C, 56D, 56E, and 56F are any circuit consisting of an electrode formed on the circuit board or 3-D circuit consisting of capacitance and inductance.

When the contact knob 45A, 45B, or 45C is in the positions of FIG. 4, the lower ends of the movable contact pivots 45A1 and 45A2 are brought into contact with the delay element connection pads 53A1 and 53A2, 53C1 and 53C2, or 53E1 and 53E2. When the contact knob 45A, 45B, or 45C is moved to the middle position of the opening 44A, 44B, or 44C in FIG. 4, the lower ends of the movable contact pivots are brought into contact with the series connection fixed contact pad 54A, 54B, or 54C. When the contact knob 45A, 45B, or 45C is further moved to the right position, the lower ends of the movable contact pivots 45A1 and 45A2 are brought into contact with the delay element connection pads 53B1 and 53B2, 53D1 and 53D2, or 53F1 and 53F2, respectively. Now, as FIG. 7 shows, the contact knobs 45A, 45B, and 45C are set in the left, middle, and right positions, respectively, the lower ends of the respective movable contacts 46A, 46B, and 46C are brought into contact with the fixed contact pads as marked with dots. Consequently, the delay elements 56A and 56F are connected in series across the input and output terminals 47 and 48. Since the fixed pads have little or no delay, the amount of delay of the variable delay line is equal to the sum of the amounts of delay of the delay elements 56A and 56F.

Since there are no mismatching elements in this circuit, the high frequency characteristics of the variable delay line is improved very much.

By moving each of the three contact knobs 45A, 45B, and 45C to one of the three positions; left, middle, and right in FIG. 7, it is possible to provide 9 (=3×3) different amounts of delay.

Although the distances between the contact pads are different depending on the switching conditions, for example, the distance between 53A2 and 53C1 and the distance between 53A2 and 54B or 53D1 are different, it is possible to absorb this difference by making the movable contacts 46A, 46B, and 46C from a spring material. The change in length of the movable contact changes the height of the movable contact from the circuit board, thus disturbing the impedance. However, since the electrical length of this distance is much smaller than that of the conventional mismatching element, and the impedance disturbance is not complete mismatching, this variable delay line is much better than the conventional one in terms of high frequency characteristics.

Alternatively, the number of contact knobs and the number of delay elements may be different from those of the above embodiments.

We claim:

1. A variable delay line comprising:
a housing package;
an input terminal extending outwardly from said housing package;
an output terminal extending outwardly from said housing package;
a circuit board provided within said housing package;
an input terminal connection land provided on said circuit board and connected to an end of said input terminal;
an output terminal connection land provided on said circuit board and connected to an end of said output terminal;
a plurality of delay elements;
a plurality of pairs of delay element connection fixed pads, each pair thereof connected to each of said delay elements;
a plurality of sets of series connection fixed contact pads each set corresponding to each pair of said delay element connection fixed pads and connectable in series across said input and output terminal connection lands; and
a plurality of sliding knobs provided in said housing package each having a pair of movable contacts for electrically connecting either one of said delay element connection fixed contact pads to one of said series connection fixed contact pads or one of said series connection fixed contact pads in a set to the rest of said set.

2. A variable delay line comprising:
a housing having a plurality of openings on a top thereof;
a circuit board provided within said housing;
input and output terminal connection lands provided on opposite end portions of said circuit board;
a plurality of pairs of first series connection fixed contact pads disposed between said input and output terminal connection lands, with most outside pads connected to said input and output terminal connection lands, respectively, and intermediate pads connected adjacent pads;
a plurality of second series connection fixed contact pads, each disposed close to each pair of first series connection pads;
a plurality of pairs of delay element connection pads, each pair corresponding to each pair of said first series connection pads beyond each of said second series connection pads and connected to a delay element; and
a plurality of contact means each movable within each of said openings of said housing between first and second positions and having a pair of movable contacts such that when a contact means is moved to said first or second position, a pair of movable contacts of said contact means connect a pair of said first series connection pads to either said second series connection pad, with corresponding delay element connection pads disconnected, or said corresponding delay element connection pads, with said second series connection pad disconnected, thereby minimizing mismatching elements of said variable delay line.

3. A variable delay line comprising:
a housing having a plurality of openings on a top thereof;
a circuit board provided within said housing;
input and output terminal connection lands provided on opposite end portions of said circuit board;
a row of series connection fixed contact pads aligned between said input and output terminal connection lands;
two rows of pairs of delay element connection pads disposed on opposite sides of said series connection fixed contact pads, each pair on either side corresponding to each of said series connection fixed contact pads and connected to a delay element; and
a plurality of contact means each movable within each of said openings of said housing among first, second, and third positions and having a pair of contacts interconnected to adjacent contacts such that when a contact means is moved to said first, second, or third position, a pair of contacts of said contact means connect only a first-row delay element connection fixed contact pad, series connection pad, or second-row delay element connection fixed contact pad in a series circuit between said input and output terminal connection pads, thereby minimizing mismatching elements within said variable delay line.

* * * * *